United States Patent
Borrel et al.

(10) Patent No.: US 10,223,482 B2
(45) Date of Patent: Mar. 5, 2019

(54) MACHINE LEARNING ASSISTED RESERVOIR SIMULATION

(71) Applicant: International Business Machines Corporation, Armonk, NY (US)

(72) Inventors: Paul Borrel, Rio de Janeiro (BR); Matthias Kormaksson, Rio de Janeiro (BR); Carmen Nilda Mena Paz, Rio de Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 15/197,734

(22) Filed: Jun. 29, 2016

(65) Prior Publication Data

US 2018/0004865 A1     Jan. 4, 2018

(51) Int. Cl.
| | | |
|---|---|---|
| *G06F 17/50* | (2006.01) | |
| *G06N 99/00* | (2019.01) | |
| *E21B 41/00* | (2006.01) | |
| *G01V 11/00* | (2006.01) | |

(52) U.S. Cl.
CPC .......... *G06F 17/5009* (2013.01); *E21B 41/00* (2013.01); *G01V 11/00* (2013.01); *G06N 99/005* (2013.01)

(58) Field of Classification Search
CPC .......................... G06F 17/5009; G06N 99/005
USPC ........................................................ 703/10
See application file for complete search history.

(56) References Cited

U.S. PATENT DOCUMENTS

| | | | |
|---|---|---|---|
| 7,447,614 B2 | 11/2008 | Ghaboussi et al. | |
| 9,069,916 B2 * | 6/2015 | Sarma | G06N 7/005 |
| 2013/0175030 A1 * | 7/2013 | Ige | E21B 43/128 |
| | | | 166/250.15 |
| 2015/0339572 A1 * | 11/2015 | Achin | G06N 5/02 |
| | | | 706/46 |

OTHER PUBLICATIONS

Gradient Boosting archived Wikipedia dated May 8, 2016 downloaded from https://en.wikipedia.org/w/index.php?title=Gradient_boosting&oldid=719234230*

E.M.R. Fairbairn et al., "Use of neural networks for fitting of FE probabilistic scaling model parameters," International Journal of Fracture, Jan. 1999, v. 95, n. 1, p. 315-324, Kluwer Academic Publishers.

(Continued)

*Primary Examiner* — Brian S Cook
(74) *Attorney, Agent, or Firm* — Grant A. Johnson; Otterstedt, Ellenbogen & Krammer, LLP (57) ABSTRACT

An embodiment includes a method for use by at least one machine learning classifier. The method comprises the machine learning classifier obtaining one or more recent results from at least one geomechanical simulation; the machine learning classifier comparing the recent results to stored historical data; and, based on the comparing, the machine learning classifier deciding at least one reservoir model for use by at least one reservoir simulation.

17 Claims, 9 Drawing Sheets

(56) References Cited

OTHER PUBLICATIONS

C.N.M. Paz, "Implementation and Development of Probabilistic Model for 2D and 3D Discrete Cracking Concrete in Vector-Parallel Computing," Oct. 2000, p. 1-113, Doctoral Thesis, Program of Civil Engineering, Alberto Luiz Coimbra Institute for Graduate Studies and Research in Engineering (COPPE), Federal University of Rio de Janeiro (UFRJ), Brazil, http://www.coc.ufrj.br/index.php/doctoral-thesis/339-2000/3519-carmen-nilda-mena-paz#download, in Portuguese with English abstract p. vii.
H. Zhao et al., "Simulating the Stress-Strain Relationship of Geomaterials by Support Vector Machine," Mathematical Problems in Engineering, Aug. 2014, v. 2014, Article ID 482672, p. 1-7, Hindawi Publishing Corporation.
S. K. Kallyan, "Model of Least Square Support Vector Machine (LSSVM) for Prediction of Fracture Parameters of Concrete," Jun. 2011, International Journal of Concrete Structures and Materials (IJCSM), v. 5, n. 1, p. 29-33, Korea Concrete Institute (KCI).
V. A. A. Kjøsnes, "Effects of Fracture Capillary Pressure and non-straight Relative Permeability Lines," May 2012, p. 1-121, Department of Petroleum Engineering and Applied Geophysics (IPT), Norwegian University of Science and Technology (NTNU), Trondheim, Norway, http://hdl.handle.net/11250/239718.
P. Leonnier & B. Bourbiaux, "Simulation of Naturally Fractured Reservoirs. State of the Art: Part 1—Physical Mechanisms and Simulator Formulation," Oil & Gas Science and Technology, Apr. 2010, v. 65, n. 2, p. 239-262, Institut Français du Pétrole.
P. Leonnier & B. Bourbiaux, "Simulation of Naturally Fractured Reservoirs. State of the Art: Part Part 2—Matrix-Fracture Transfers and Typical Features of Numerical Studies", Oil & Gas Science and Technology, Apr. 2010, v. 65, n. 2, p. 263-286, Institut Français du Pétrole.
P. Stafford et al., "Influence of fracture truncation on dispersion: A dual permeability model," Journal of Contaminant Hydrology, 1998, v. 30, p. 79-100, Elsevier Science B.V.
Schlumberger, "Eclipse Reference Manual," Version 2013.2, Nov. 2013, Chapter 2, pp. 67-294, plus table of contents.
Schlumberger, Eclipse Industry-Reference Reservoir Simulator. Downloaded from https://www.software.slb.com/products/eclipse on Jun. 24, 2016, pp. 1-3.
Schlumberger, Visage Finite-Element Geomechanics Simulator. Downloaded from https://www.software.slb.com/products/visage on Jun. 24, 2016, pp. 1-2.
J. E. Warren & P. J. Root, "The Behavior of Naturally Fractured Reservoirs," Society of Petroleum Engineers Journal (SPEJ), Sep. 1963, v. 3, n. 3, p. 245-255, SPE-426-PA.
X. Zhang & D.J. Sanderson, Numerical Modelling and Analysis of Fluid Flow and Deformation of Fractured Rock Masses, 2002, p. 1-288, Pergamon.

* cited by examiner

MACHINE LEARNING ASSISTED RESERVOIR SIMULATION

FIELD OF THE INVENTION

The present invention relates to the electrical, electronic and computer arts, and, more particularly, to geomechanical simulation of a reservoir.

BACKGROUND OF THE INVENTION

One of the most challenging problems in the petroleum industry is the understanding and prediction of subsidence at the surface due to formation compaction that happens as a result of fluid withdrawal from the reservoir. In some oil fields (e.g., poorly compacted reservoirs), stress changes associated with reservoir compaction can have beneficial results on fluid recovery (e.g., oil and gas production).

However, reservoir compaction may also reduce permeability, causing surface subsidence and damaging well equipment. Subsidence phenomena can cause excessive stress at the well casing, which can result in casing buckling and/or casing sheer. Subsidence phenomena can also cause excessive stress within the completion zone, where collapse of structural integrity could lead to loss of production (e.g., due to pressure decline). Subsurface subsidence can result in problems at the wellhead or with pipeline systems and platform foundations. Mudline subsidence can cause fault activation or movement, which in turn can result in reduced wellbore stability (e.g., due to concrete cracking) or subsea wellhead failures. Open or closed fractures can occur in a production well or an injection well, or along a production length or an injection length.

Progressive activation of faults and fractures affect phenomena such as stress arching and a nonlinear stress path. Unlike standard compaction drive simulation, there is no simple linear method to account for the effects of stress on permeability, especially for fractured systems, in which the changes of permeability might be directional, localized, and strongly nonlinear. As a result, fluid flow in a porous medium under such scenarios cannot be simplified to compressibility or pressure dependent porosity/permeability changes. Modeling of such processes is achieved by incorporation of geomechanical effects resulting from fluid flow in the porous medium.

Thus, many applications in the petroleum industry require modeling of both the porous flow of reservoir fluids (reservoir simulation) and of mechanical deformation caused by reservoir stresses and displacements (geomechanical simulation) to produce realistic results of reservoirs under production and especially to simulate the behavior of naturally fractured reservoirs. For example, reservoir simulation coupled with geomechanical simulation is used to model reservoir fluid flows and physical phenomena such as compaction, subsidence, induced fracturing, enhancement of natural fractures and/or fault activation.

This coupling may be implemented using an algorithm in which information is exchanged between a reservoir simulator and a geomechanical simulator in an iterative, staggered manner. The coupling of geomechanical and reservoir simulations in hydrocarbon or gas reservoir production induces variations in time and space of reservoir pressure, saturation and temperature. In turn, changes in thermal and hydraulic reservoir properties may cause a modification of the stress state in and around the reservoir. The stress changes may then alter the reservoir fluid flow parameters and then the reservoir production scenario.

In conventional approaches, a reservoir model is selected, and then that reservoir model is utilized for the coupling (e.g., the model is utilized by both a reservoir simulator and a geomechanical simulator). Once a reservoir model is selected, then the coupling (e.g., both reservoir simulation and geomechanical simulation) must be fully implemented using only that model. Once coupling is completed using the selected model, if the coupling using the selected model leads to unsatisfactory results, the selected model is abandoned and a new (e.g., more complex) model is selected instead. Coupling must then be fully re-implemented using the new model. For example, after coupling (e.g., both reservoir simulation and geomechanical simulation) is completed using a "single porosity" model, if the results are unsatisfactory, the "single porosity" model is replaced with a more complex "dual porosity" model and the entire coupling process (e.g., both reservoir simulation and geomechanical simulation) is repeated using the new "dual porosity" model.

SUMMARY OF THE INVENTION

Principles of the invention provide techniques for use by at least one machine learning classifier. An illustrative embodiment of the present invention includes the machine learning classifier obtaining one or more recent results from at least one geomechanical simulation; the machine learning classifier comparing the recent results to stored historical data; and, based on the comparing, the machine learning classifier deciding at least one reservoir model for use by at least one reservoir simulation.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects; e.g. dynamic reconfiguration, including switching a reservoir model, during a coupled workflow. Thus, an illustrative embodiment of the invention may advantageously help professionals in interdisciplinary areas making decisions in oil exploration analysis.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
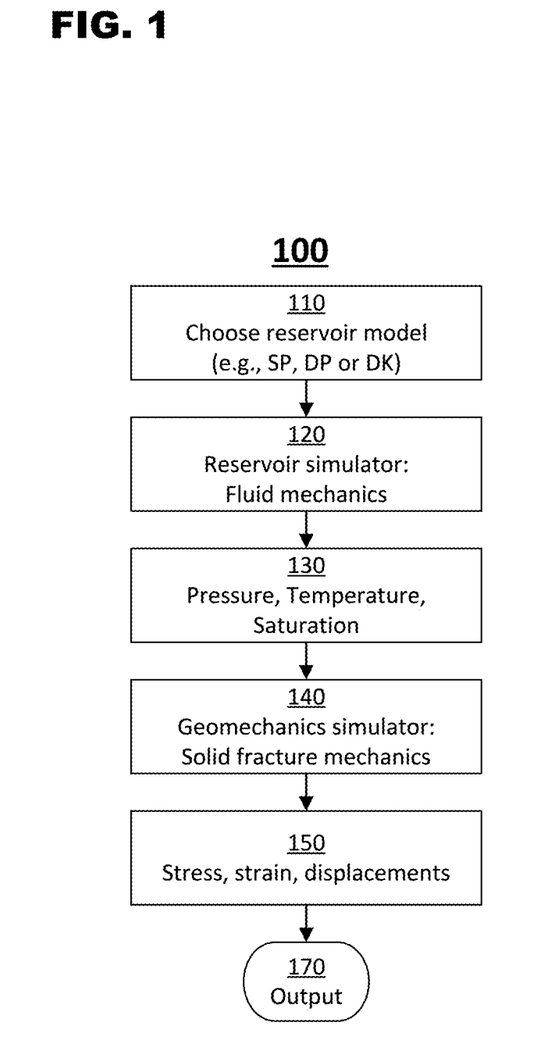
FIG. 1 is a flowchart showing a conventional one-way coupling algorithm.

Known coupling algorithms include one-way coupling (1WC) and two-way coupling (2WC). FIG. 1 is a flowchart showing a conventional one-way coupling (1WC) algorithm 100. Algorithm 100 begins with the selection of a reservoir model in step 110. This selection may be made manually by a user or automatically by a computer. As discussed above, the selected reservoir model is used for all subsequent simulation, including reservoir simulation 120 and geomechanical simulation 140. The reservoir model may be selected from a group including single porosity (SP), dual porosity (DP), and dual permeability (DK). In step 120, the selected reservoir model is used by a reservoir simulator to analyze fluid mechanics thereby computing pressure, temperature, and saturation (PTS) values 130. The PTS values 130, as well as the selected reservoir model 110, are used in step 140 by a geomechanical simulator to analyze solid fracture mechanics thereby computing stress, strain, and displacement values 150. The values 130 computed by the reservoir simulator and the values 150 computed by the geomechanical simulator are output in step 170 and algorithm 100 terminates.

Figure 2:
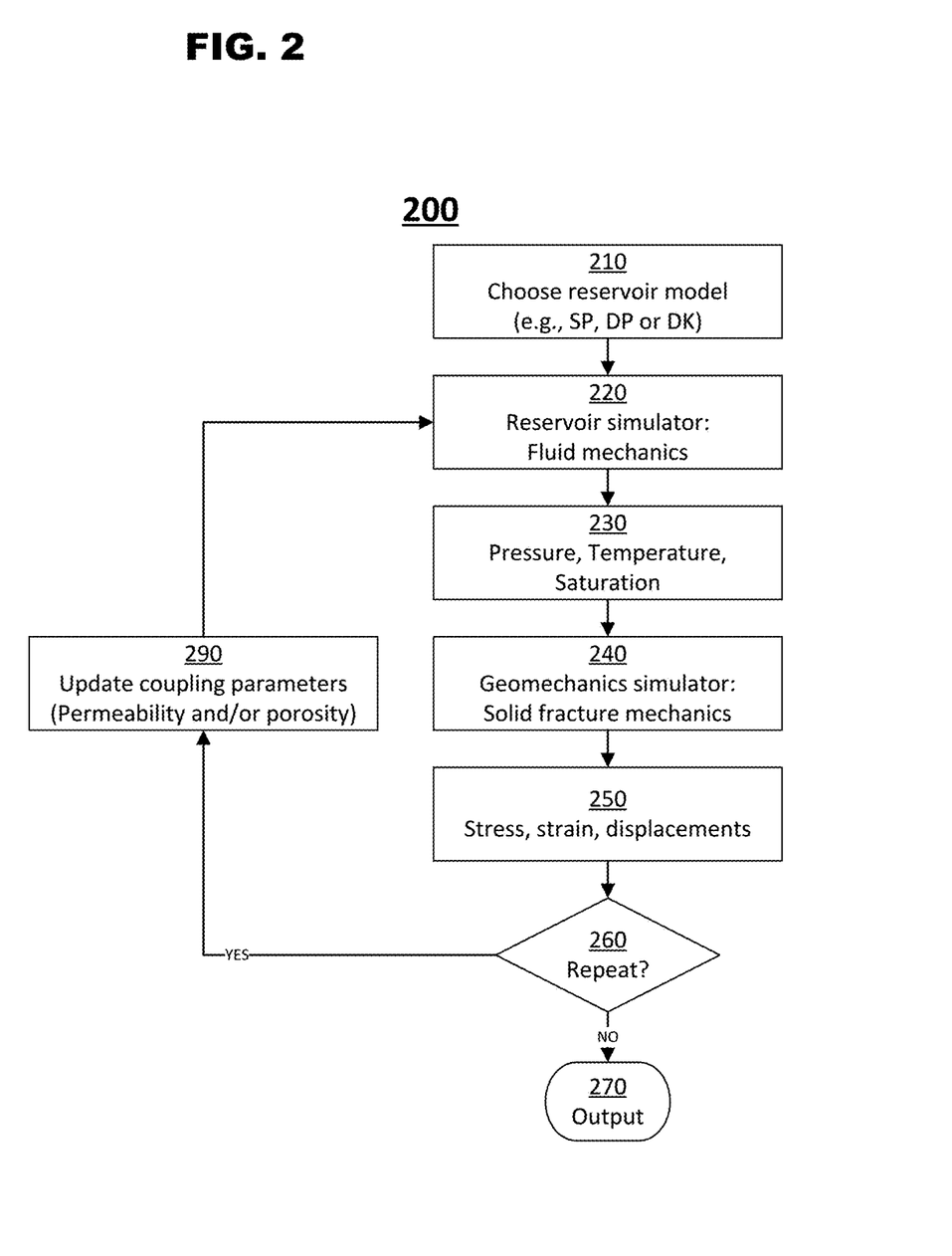
FIG. 2 is a flowchart showing a conventional two-way coupling algorithm.

FIG. 2 is a flowchart showing a conventional two-way coupling (2WC) algorithm 200. Steps 210, 220, 230, 240, 250 and 270 in algorithm 200 respectively correspond to steps 110, 120, 130, 140, 150 and 170 in algorithm 100, discussed above with reference to FIG. 1. Algorithm 200 begins in step 210 with the selection of a reservoir model. This selection may be made manually by a user or automatically by a computer. As discussed above, the selected reservoir model is used for all subsequent simulation, including reservoir simulation 220 and geomechanical simulation 240. The reservoir model may be selected from a group including single porosity (SP), dual porosity (DP), and dual permeability (DK). In step 220, the selected reservoir model is used by a reservoir simulator to analyze fluid mechanics thereby computing pressure, temperature, and saturation (PTS) values 230. The PTS values 230, as well as the selected reservoir model 210, are used in step 240 by a geomechanical simulator to analyze solid fracture mechanics thereby computing stress, strain, and displacement values 250.

In step 260, a determination is made as to whether to repeat the above steps. This determination may be made manually by a user or automatically by a computer. For example, the steps may be repeated a predetermined number of times. If the determination in step 260 is no, then the values 230 computed by the reservoir simulator and the values 250 computed by the geomechanical simulator are output in step 270 and algorithm 200 terminates. If the determination in step 260 is yes, then coupling parameters (e.g., permeability and/or porosity) are updated in step 290, and the algorithm is repeated beginning with step 220 using the updated coupling parameters. It is important to note that step 210 is not repeated. Once a reservoir model is selected in step 210, it cannot subsequently be changed in algorithm 200.

Figure 3:
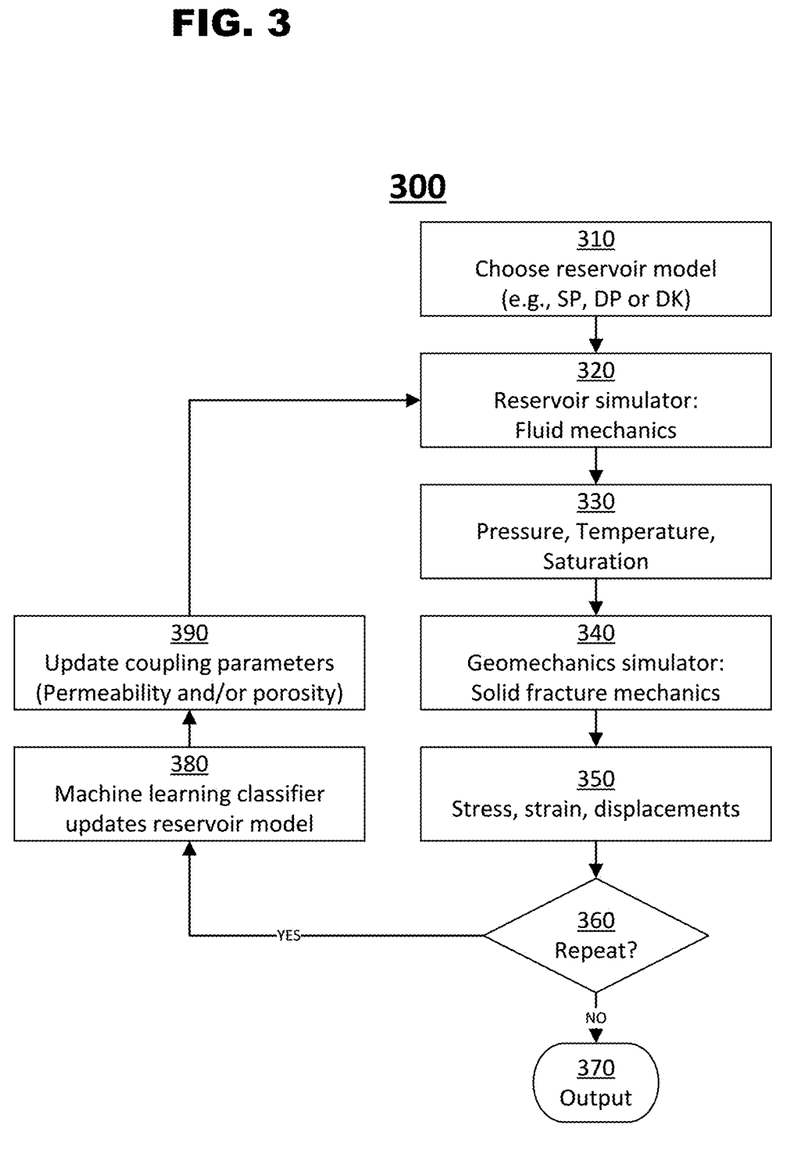
FIG. 3 is a flowchart showing a dynamic two-way coupling algorithm, according to an aspect of the invention.

FIG. 3 is a flowchart showing a dynamic two-way coupling algorithm 300 according to an aspect of the invention. Steps 310, 320, 330, 340, 350, 360, 370 and 390 in algorithm 300 respectively correspond to steps 210, 220, 230, 240, 250, 260, 270 and 290 in algorithm 200, discussed above with reference to FIG. 2. Steps 310, 320, 330, 340, 350 and 370 in algorithm 300 also correspond respectively to steps 110, 120, 130, 140, 150 and 170 in algorithm 100, discussed above with reference to FIG. 1.

Algorithm 300 begins in step 310 with the initial selection of a reservoir model. The reservoir model may be selected from a group including single porosity (SP), dual porosity (DP), and dual permeability (DK). In step 320, the reservoir model, and potentially input from one or more sensors, is used by a reservoir simulator to analyze fluid mechanics thereby computing pressure, temperature, and saturation (PTS) values 330. The PTS values 330, as well as the reservoir model 310, are used in step 340 by a geomechanical simulator to analyze solid fracture mechanics thereby computing stress, strain, and displacement values 350.

In step 360, a determination is made as to whether to repeat the above steps. This determination may be made manually by a user or automatically by a computer. For example, the steps may be repeated a predetermined number of times. If the determination in step 360 is no, then the values 330 computed by the reservoir simulator and the values 350 computed by the geomechanical simulator are output in step 370, and may be used to control hardware, and algorithm 300 terminates.

If the determination in step 360 is yes, then algorithm 300 proceeds to step 380, which does not correspond to any step in algorithm 100 or algorithm 200. In step 380, a machine learning classifier analyzes the output 350 from geomechanical simulation 340 and updates the reservoir model. For example, the machine learning classifier may select a different type of reservoir model (e.g., "dual porosity" instead of "single porosity") than that which was previously selected, e.g., in step 310 and/or a previous iteration of step 380. The machine learning classifier may implement the new selection automatically, or the selection may be presented to a user for confirmation prior to implementation. Thus, algorithm 300 advantageously facilitates dynamic reconfiguration and switching a reservoir model during the workflow. Coupling parameters (e.g., permeability and/or porosity) are then updated in step 390, and the algorithm is repeated beginning with step 320 using the updated reservoir model and coupling parameters.

Figure 4:
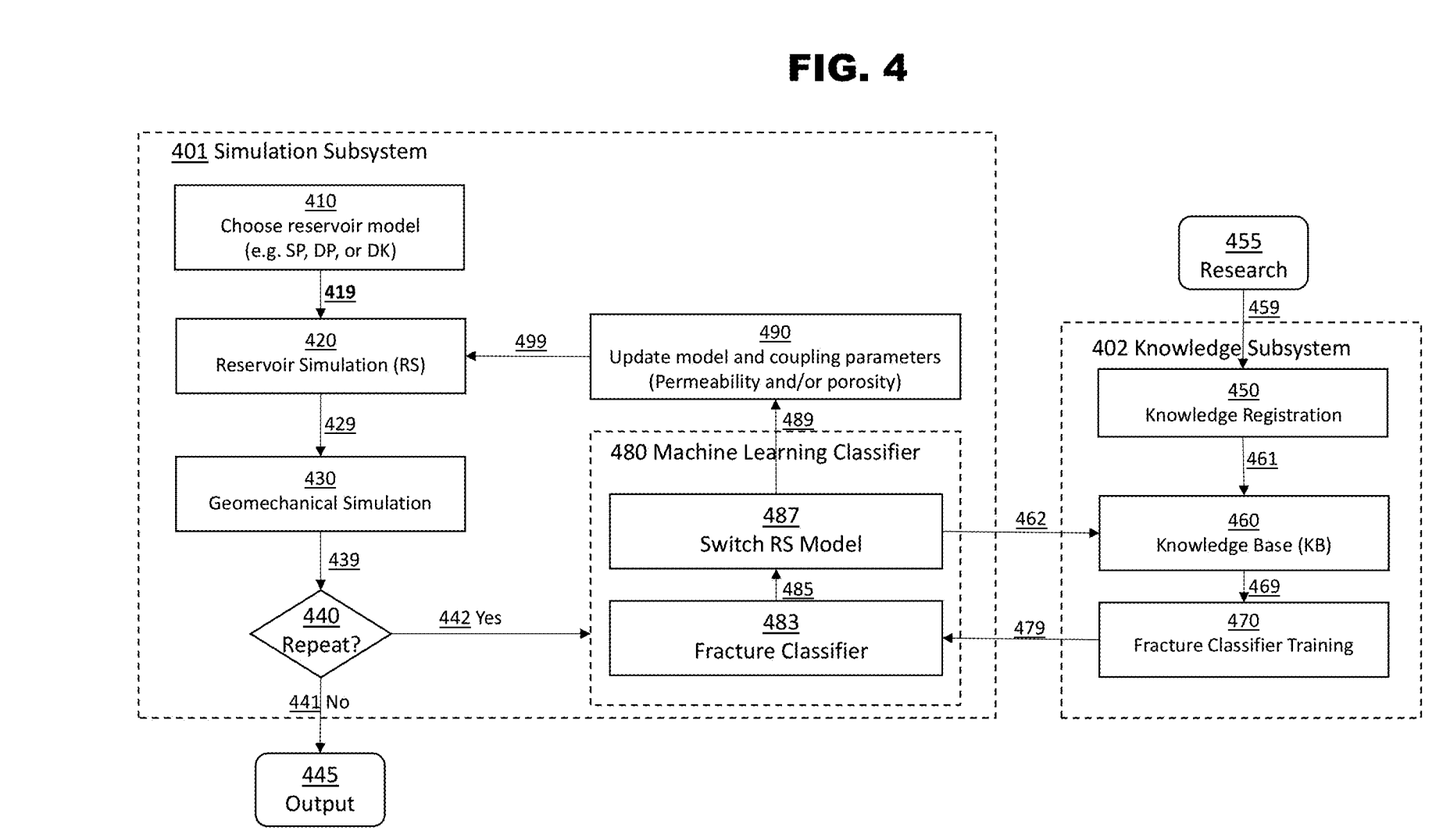
FIG. 4 shows a combined block diagram and flow chart, according to an aspect of the invention.

FIG. 4 shows a combined block diagram and flow chart, according to an aspect of the invention. System 400 in FIG. 4 includes simulation subsystem 401 and knowledge subsystem 402. Simulation subsystem 401 implements an algorithm similar to algorithm 300 discussed above with reference to FIG. 3. Generally, elements 410, 420, 429, 430, 439, 440 and 445 of simulation subsystem 401 respectively correspond to steps 310, 320, 330, 340, 350, 360 and 370 shown in FIG. 3.

Within simulation subsystem 401, a reservoir model 419 is initially chosen in 410, e.g., from a group including single porosity (SP), dual porosity (DP), and dual permeability (DK). Reservoir simulator 420 uses the reservoir model 419 chosen in 410, and potentially input from one or more sensors, to analyze fluid mechanics thereby computing pressure, temperature, and saturation (PTS) values 429, which are input to geomechanical simulator 430. Geomechanical simulator 430 analyzes solid fracture mechanics thereby computing output values 439 (e.g., stress, strain, and/or displacement).

Next, a determination is made at module 440 as to whether to repeat the above steps. This determination may be made manually by a user or automatically by a computer. Thus, module 440 may optionally include a user interface. For example, the steps may be repeated a predetermined number of times. If the determination at module 440 is no 441, then the values 439 computed by the geomechanical simulator 430 and the values 429 computed by the reservoir simulator 420 are output 445, and may be used to control hardware, and the operation of simulation subsystem 401 terminates. If the determination at module 440 is yes 442, then subsystem 401 goes to Machine Learning Classifier module 480 and updating module 490, which provides the updated model and coupling parameters 499 to reservoir simulator 420, before repeating the above steps of reservoir simulation 420 with output 429 and geomechanical simulation 430 with output 439.

If the determination at module 440 is yes 442 geomechanical simulator output 439 is input to machine learning classifier 480 within simulation subsystem 401. Machine learning classifier 480 includes fracture classifier 483 and model switcher 487. Fracture classifier 483 applies machine learning techniques to the output values 439 from geomechanical simulator 430. As further discussed below, different geomaterials are characterized by mechanical properties and fracture behaviors, such as stress-strain curves. Fracture classifier 483 can then properties of a specific geomaterial to analyze the results 439 of the geomechanical simulator 430 to determine whether fractures are present, moving and/or connected.

Based on determinations 485 by fracture classifier 483, model switcher 487 can determine whether the reservoir model is appropriate or needs to be updated. The reservoir model may be selected from a group including single porosity (SP), dual porosity (DP), and dual permeability (DK). The model switcher 487 may implement the new selection automatically, or the selection may be presented to a user for confirmation prior to implementation. Thus, model switcher 487 may optionally include a user interface.

Model switcher 487 then provides the reservoir model 489, which may or may not have been updated, and this model along with coupling parameters (permeability and/or porosity) are updated in 490 and provided 499 to reservoir simulator 420. Reservoir simulator 420 and/or geomechanical simulator 430 may optionally be implemented using commercially available software known to one skilled in the art.

In addition to simulation subsystem 401, system 400 includes knowledge subsystem 402. Knowledge subsystem 402 includes knowledge registration 450, knowledge base 460, and fracture classifier training 470. Fracture classifier training 470 updates 479 fracture classifier 483 based on data from knowledge base 460.

Knowledge base 460 is a database which may include data from either, or both, knowledge registration module 450 (input 461) and/or model switcher 487 (input 462). It should be noted that input 462 is shown in FIG. 4 as being received specifically from model switcher 487, input 462 may be received more generally from machine learning classifier 480, and still more generally from simulation subsystem 401.

Input 461 involves registration 450 of knowledge (e.g., rules, properties, data, etc.) 459 found in research literature 455 that provide guidance as to which reservoir model 489 is appropriate for a given stress, strain, and geomaterial. Input 461 may be used to initialize knowledge base 460 prior to execution of simulation subsystem 401. Input 461 may include updates to knowledge base 460 provided during and/or after execution of simulation subsystem 401.

Input 462 involves registration of the decisions 489 made by model switcher 487 (and/or decisions 485 made by fracture classifier 483), as well as the corresponding values 439 from geomechanical simulation 430 (and/or output 485 from fracture classifier 483) upon which decisions 489 were based. Input 462 may be used to iteratively update knowledge base 460 during and/or after each execution of simulation subsystem 401, and more specifically each execution of machine learning classifier 480.

As previously discussed, model switcher 487 may involve providing a recommendation regarding a reservoir simulation, possibly accompanied by reasoning and/or justification, for evaluation by a human expert prior to making a final decision. If knowledge base 460 is of poor quality (e.g., not enough training data has been accumulated), then model switcher 487 may be programmed to give no recommendation and thus model choice would rely entirely on expert domain knowledge. Conversely, if knowledge base 460 is of high quality (e.g., sufficient training data has been accumulated), the model choice may be fully automated, such that the user would not have to rely on expert knowledge.

Figure 5:
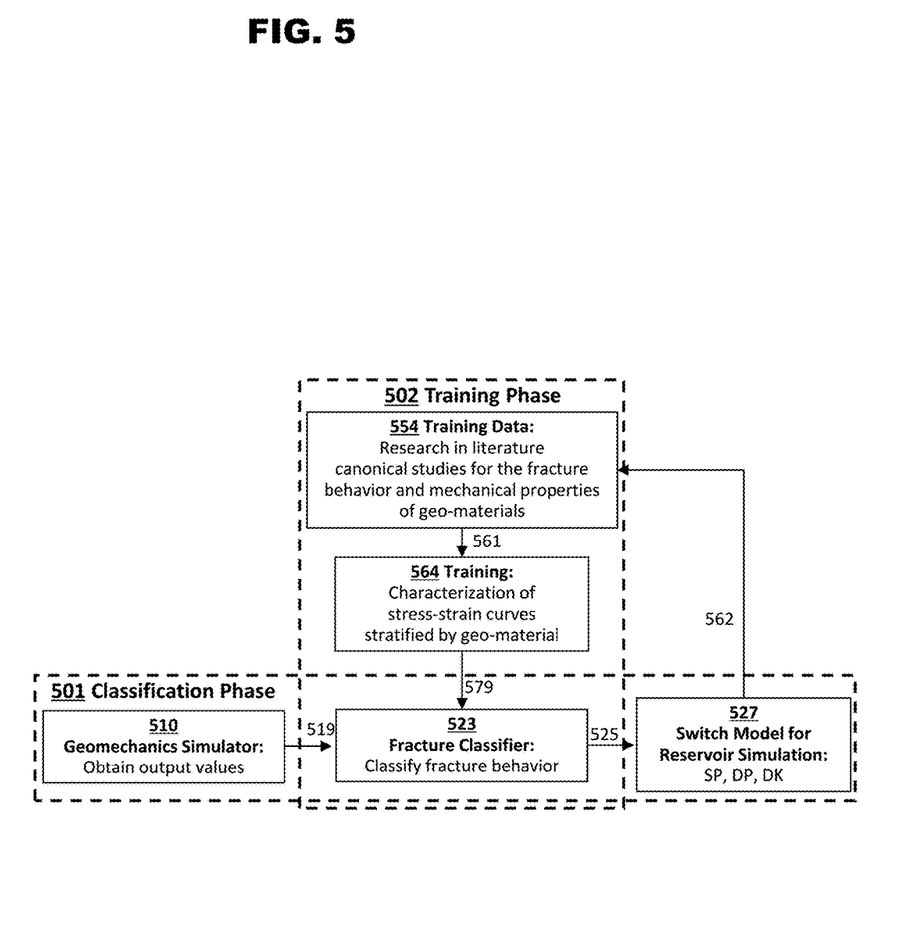
FIG. 5 shows another combined block diagram and flow chart, according to an aspect of the invention.

FIG. 5 shows a combined block diagram and flow chart, according to an aspect of the invention. The elements shown in FIG. 5 are similar to, but not necessarily identical to, a subset of the elements within system 400 discussed above with reference to FIG. 4. Generally, classification phase 501 corresponds to a subset of simulation system 401, and elements 510, 519, 523, 525 and 527 respectively correspond to elements 430, 439, 483, 485 and 487 shown in FIG. 4.

Training phase 502 corresponds generally to knowledge subsystem 402. Elements 561, 562 and 579 respectively correspond to elements 469, 462 and 479 shown in FIG. 4. Element 554 corresponds generally to element 460 shown in FIG. 4, and includes research in literature for canonical studies of the mechanical properties and/or fracture behavior of various geomaterials. Element 564 corresponds generally to element 470 shown in FIG. 4, and includes characterization of stress-strain curves stratified by geomaterial.

Accordingly, one or more embodiments of the present invention may provide a cognitive system that analyzes historical geomechanical data to create a classifier capable of making automated decisions using output from a geomechanical simulator as classifier input. One or more embodiments may include automatic post-processing of geomechanical simulation results by the classifier, including analysis of displacements, stresses and strain to predict the best model for reservoir simulation based on fracture mechanics in the geomaterial.

Results from a geomechanical simulator are continuously analyzed in order to determine and/or reevaluate the appropriateness of the underlying reservoir model. A machine learning classifier is applied to geomechanical simulator output in order to determine whether fractures are present, whether fractures are moving, and whether fractures are connected. The answers to these questions determines which reservoir model is most appropriate.

Single porosity modeling, involves use of a standard reservoir simulator and modeling of a fracture and matrix explicitly. Single porosity models are suitable for static scenarios (i.e., no moving fractures). Naturally fractured reservoirs are characterized by the presence of two distinct types of porous media: matrix and fracture. Dual-porosity models are applied to highly fractured media where flow occurs between connected fractures (high permeability) and no flow occurs between matrix blocks. In dual permeability models, fluid flow is assumed to happen not only between connected fractures, but can occur between matrix blocks too. This happens mostly in non-connected fracture settings (low permeability).

Figure 6:
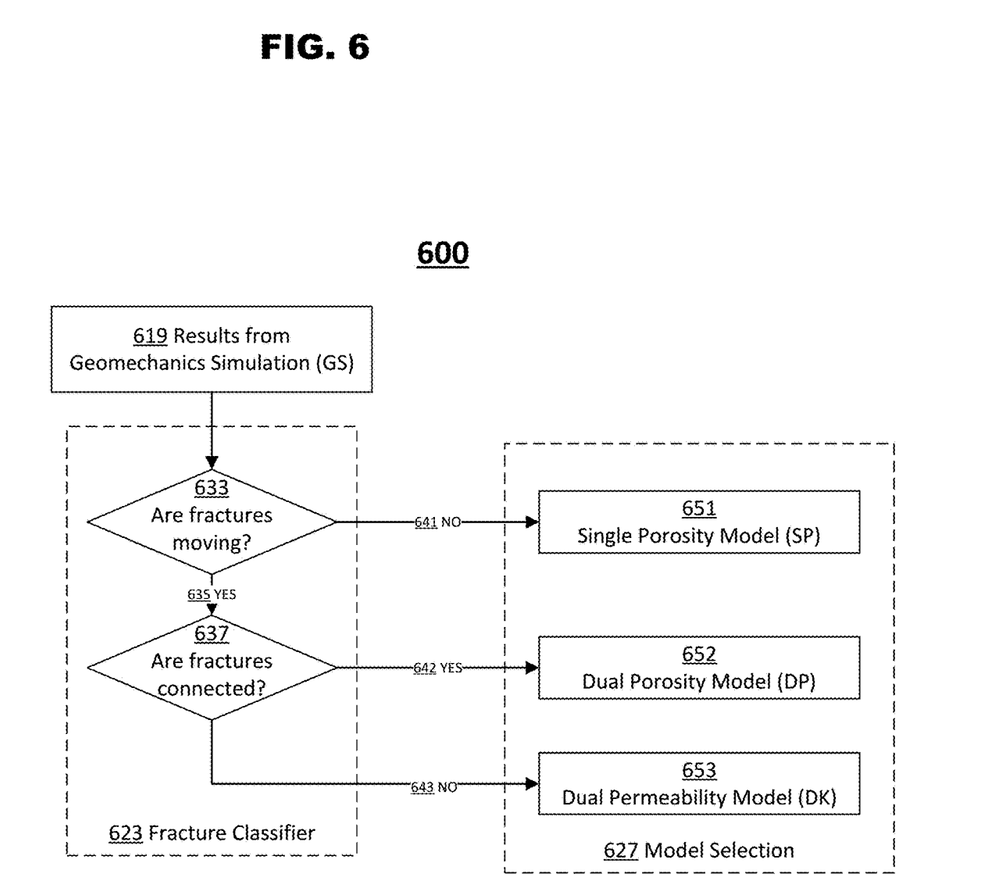
FIG. 6 is a flowchart showing a classification algorithm according to an aspect of the invention.

FIG. 6 is a flowchart showing a classification algorithm 600 according to an aspect of the invention. Algorithm 600 may be implemented by a classifier similar to 420 in FIG. 4 and/or may be implemented in connection with step 380 in FIG. 3. Elements 619, 623 and 627 in FIG. 6 respectively correspond to elements 519, 523 and 527 in FIG. 5, as well as elements 419, 423 and 427 in FIG. 4.

Fracture classifier 623 obtains geomechanical simulation results 619. Based on these results, fracture classifier 623 detects whether one or more moving fractures are present 633. If no moving fractures are present 641, a single porosity (SP) model 651 is output by 627. If one or more moving fractures are present 635, fracture classifier 623 detects whether the moving fractures are connected 637. If the moving fractures are connected 642, a dual porosity (DP) model 652 is output by 627. If the moving fractures are not connected 643, a dual permeability (DK) model 653 is output by 627.

Figure 7:
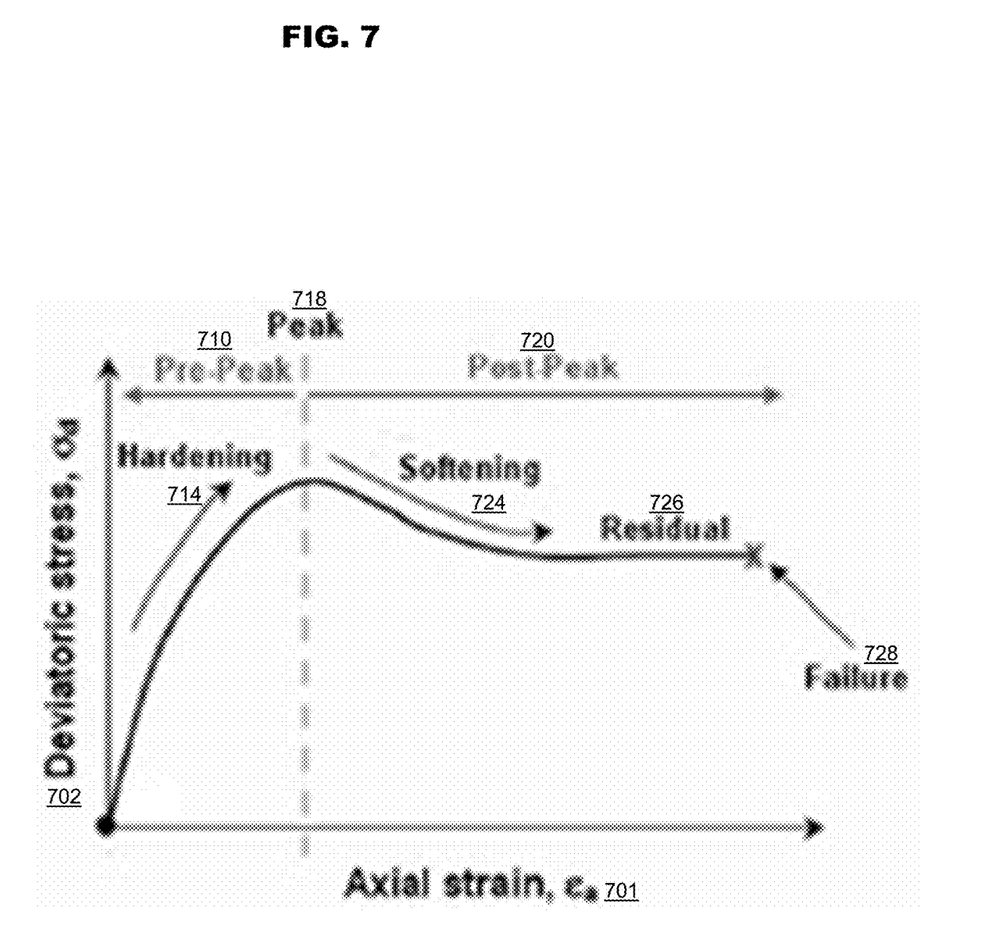
FIG. 7 shows an exemplary strain-stress curve suitable for use with an illustrative embodiment of the present invention.

FIG. 7 shows an exemplary strain-stress curve suitable for use with an illustrative embodiment of the present invention. FIG. 7 shows strain ε, and more specifically axial strain $ε_a$, along the x-axis 701. Although FIG. 7 does not indicate units, strain ε may be measured in, for example, hundreds of microinches per inch ($10^2$ μin/in). FIG. 7 shows stress σ, and more specifically deviatoric stress $σ_d$, along the y-axis 702. Although FIG. 7 does not indicate units, stress σ may be measured in, for example, megapascal (MPa), kilopascal (kPa), bar, thousands of pounds per square inch ($10^3$ psi).

The strain-stress curve shown in FIG. 7 has a peak 718, which is the strain at which the stress is at a global maximum. The curve also has a pre-peak area 710, which includes all strains less than peak 718, and a post-peak area 720, which includes all strains greater than peak 718. In the curve shown in FIG. 7, the pre-peak area 710 is characterized solely by hardening 714, in which the stress increases as strain increases. The post-peak area 720, on the other hand, includes softening 724, in which the stress decreases as strain increases, followed by residual area 726, in which the stress remains substantially constant as strain increases, and finally failure 728.

Figure 8:
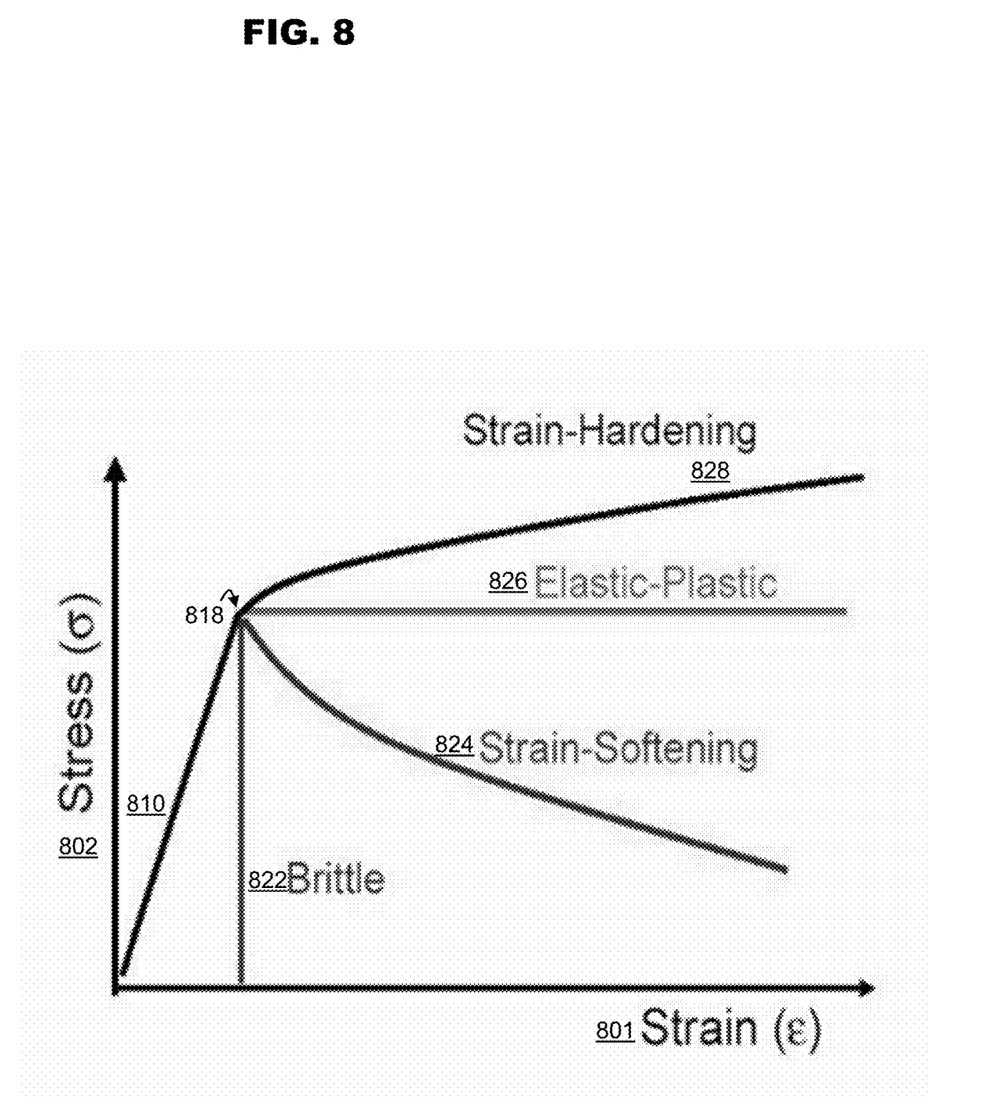
FIG. 8 shows a plurality of exemplary strain-stress curves suitable for use with an illustrative embodiment of the present invention.

Different geomaterials will have different strain-stress curves. For example, Indiana limestone and Solenhofen limestone will have different strain-stress curves. Indeed, different geomaterials may exhibit very different post-peak behaviors, as shown in FIG. 8. FIG. 8 shows a plurality of strain-stress curves, which may be associated with different materials. Strain c is on the x-axis 801, and stress σ is on the y-axis 802. For simplicity, it is assumed that the pre-peak area 810 and peak 818 of each of the curves is identical; note that this unlikely to be the case where the curves are associated with different materials.

822 shows a post-peak area for a brittle material in which failure (e.g., 728 in FIG. 7) occurs at peak 818 (corresponding to 718 in FIG. 7). 824 shows a post-peak area for a strain-softening material which exhibits behavior similar to that discussed above with reference to 724 in FIG. 7: the stress decreases as strain increases. 826 shows a post-peak area for an elastic plastic material in which the stress remains substantially constant as strain increases. 828 shows a post-peak area for a strain-hardening material in which the stress increases as strain increases.

Using fracture mechanics theory, a strain-stress curve, such as that shown in FIG. 7, can be used to determine fracture behavior:
1. If the current (strain, stress) is in the pre-peak area, then there are no fractures
2. If the current (strain, stress) is in the post-peak area, then the material is fractured
3. A steeper decline at the post-peak area indicates a more fragile geomaterial Using the algorithm shown in FIG. 6, an appropriate reservoir model can therefore be selected as follows:
1. If the current (strain, stress) is in the pre-peak area (but not near the peak), then material fractures are not moving, and a single porosity model (SP) should be used
2. If the current (strain, stress) is at or near the peak (e.g., between the pre-peak area and post-peak area), then material fractures are moving and connected, and a dual porosity model (DP) should be used
3. If the current (strain, stress) is in the post-peak area (but not near the peak), then material fractures are moving but not connected, and a dual permeability model (DK) should be used Thus, the objective of the training phase 502 in FIG. 5 and/or knowledge subsystem 402 in FIG. 4 is to characterize strain-stress curves for geomaterials existing in the literature. The objective of the classification phase 501 in FIG. 5 and/or machine learning classifier 420 in FIG. 4 is to compare (stress, strain) data output by the geomechanical simulator (i.e., current data) with the aforementioned classified stress-strain curves (i.e., historical data) to determine (i.e., classify) fracture behavior.

With reference to FIG. 4, knowledge registration 450 involves registration 461 in knowledge base 460 (corresponding to training data 554 in FIG. 5) of stress-strain curves for different geomaterials existing in the literature 455. Several stress-strain curves may be registered for the same geomaterial to reflect uncertainty in empirical studies. This may involve the complete set of all stress-strain curves found in the literature. The registered stress-strain curves may further be characterized by the mean and variability in the stress-strain curves for at least a given geomaterial. For example, the average stress-strain curve may be characterized for the geomaterial along with standard-deviations to account for variations across stress-strain curves within the same geomaterial. More generally, the characterization may involve a complete characterization of the distribution of stress-strain curves for at least a given geomaterial. This type of characterization is useful for determining how many standard deviations new (stress,strain) observations from geomechanical simulator 430 are from the average stress-strain curve of the given geomaterial and can thus help with the model classification. In an illustrative embodiment, the curves can be registered into a data array comprising columns such as (stress, strain, geomaterial, reservoir type, etc.) where each data row corresponds to a distinct (stress,strain) observation of the curve. This registered data then serves as training data 460 that is trained in 470 for fracture classifier 483.

Figure 9:
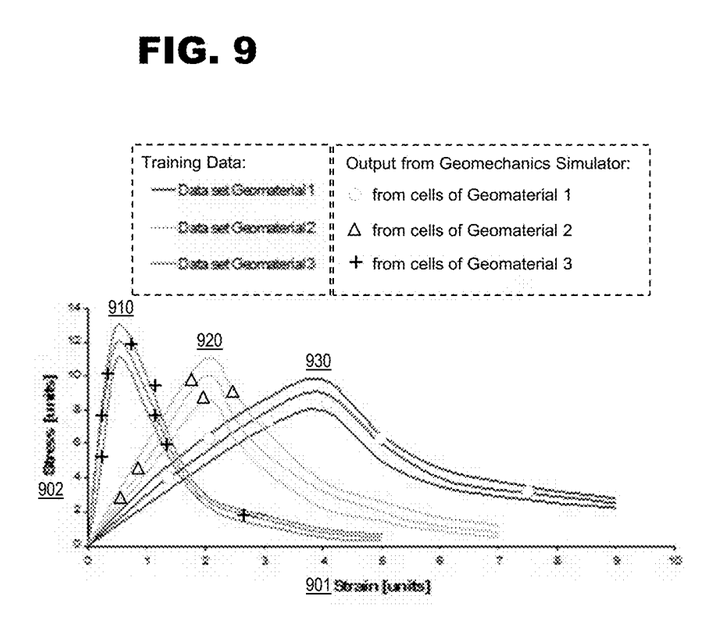
FIG. 9 shows exemplary training data for geomaterials, and corresponding output from a geomechanical simulator, according to an aspect of the invention.

FIG. 9 shows exemplary training data for geomaterials, and corresponding output from a geomechanical simulator, according to an aspect of the invention. In an illustrative embodiment, the rules discussed above can be applied by a fracture classifier comparing (strain, stress) points output from a geomechanical simulator observed at reservoir grid cells for a given geomaterial to training data curves stratified by the same geomaterial in order to compute a fracture quantification, i.e., a percentage (P) of points with fractures, which is the percentage of observed points which are in the pre-peak area of the training data curves:

1. If P<40% then material fractures are not moving, and a single porosity model (SP) should be used
2. If 40%≤P≤60% then material fractures are moving and connected, and a dual porosity model (DP) should be used
3. If P>60% then material fractures are moving but not connected, and a dual permeability model (DK) should be used The fracture classifier is a model/calculator (f) that is capable of predicting a suitable reservoir simulation model (y) from a geomechanical simulation result (x): y=f(x). In some embodiments, the choice of a reservoir model (y) may be an expert decision by a user based on domain knowledge as well as geomechanical simulation data (x), such as when the fracture classifier has not yet been sufficiently trained. With reference to FIG. 4, upon running simulation subsystem 401, and more specifically machine learning classifier 480, the geomechanical simulation results (x) and the corresponding decision as to which reservoir model to use (y) can be registered 462 into knowledge base 460. For example, the data may be registered into a data array comprising columns: (strain, stress, geomaterial, reservoir type, model chosen, etc. . . . )

After multiple uses of the simulation subsystem 401, the knowledge base 460 will accumulate training data pairs $(x_1, y_1), (x_2, y_2), (x_3, y_3) \ldots$ wherein $(x_i, y_i)$ denotes the geomechanical simulation results and corresponding model choice at the i-th use of the simulation subsystem 401. This data can then be used to train the fracture classifier 420 using conventional machine learning classification algorithms.

An illustrative embodiment of the invention may attempt to fully characterize stress-strain relationships in different geomaterials using machine learning. Given a new reservoir with calculated (stress-strain) observations, the fracture classifier can consult the catalog of training results (canonical studies) and predict whether a fracture is moving or not moving at critical regions, e.g. at closed fractures at production wells. An example decision by the fracture classifier under these circumstances may indicate that the fracture is most likely moving, with 70% probability, and may optionally be accompanied by a visualization of the fracture quantification results.

In conclusion, an illustrative embodiment of the invention includes machine learning based coupling in a research model for naturally-fractured reservoirs to help with analyzing fractures and damage in the hydrocarbon reservoir. An illustrative embodiment includes creating a library for measuring a plurality of damaged structures formed in geomaterials using solid mechanical methodology that is concerned with the stress, deformation, and fracture in rocks. Material fracture and damage identification can be provided as samples for training in order to have a Machine learning algorithm (ML) based stress-strain relationship for a geomaterial. Experimental laboratory or numerical test of the behavior of rocks under different loading patterns is conducted, and then the obtained data are used to train a ML model. If the training data contains sufficient relevant information, the trained ML model is able to characterize the stress-strain relationship of any geomaterial.

Classification of underlying physics controlling geomaterial behavior includes identification of behaviors before, during, and after the failure mechanism is initiated. The material physics processes may incorporate, for example, brittle fracture, elastic response, plastic response, displacement movements controlling plastic response, interactions governing fracture, and any combination thereof. An illustrative embodiment of the present invention includes blending of physical models with a machine-learning model that applies historical engineering experience from experimental laboratory studies and computational mechanics analysis.

One or more embodiments of the invention, or elements thereof, can be implemented, at least in part, in the form of an apparatus including a memory and at least one processor that is coupled to the memory and operative to perform exemplary method steps.

Figure 10:
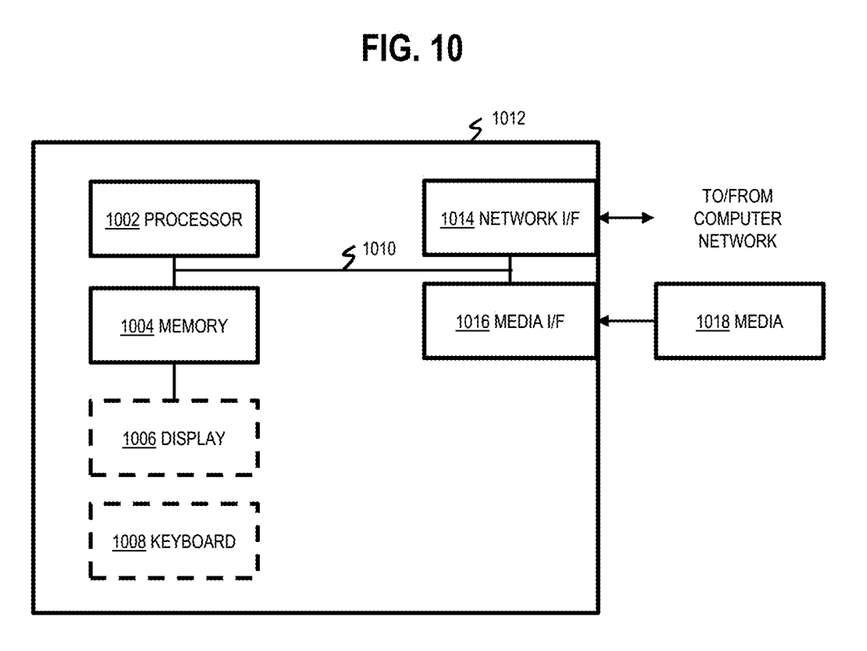
FIG. 10 depicts a computer system that may be useful in implementing one or more aspects and/or elements of the invention.

One or more embodiments can make use of software running on a general purpose computer or workstation. With reference to FIG. 10, such an implementation might employ, for example, a processor 1002, a memory 1004, and an input/output interface formed, for example, by a display 1006 and a keyboard 1008. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1002, memory 1004, and input/output interface such as display 1006 and keyboard 1008 can be interconnected, for example, via bus 1010 as part of a data processing unit 1012. Suitable interconnections, for example via bus 1010, can also be provided to a network interface 1014, such as a network card, which can be provided to interface with a computer network, and to a media interface 1016, such as a diskette or CD-ROM drive, which can be provided to interface with media 1018.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1002 coupled directly or indirectly to memory elements 1004 through a system bus 1010. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1008, displays 1006, pointing devices, and the like) can be coupled to the system either directly (such as via bus 1010) or through intervening I/O controllers (omitted for clarity).

Network adapters such as network interface 1014 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1012 as shown in FIG. 12) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein. The method steps can then be carried out using the distinct software modules and/or sub-modules of the system, as described above, executing on one or more hardware processors 1002. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for controlling wellhead equipment in a fluid reservoir, the method comprising:
   at least one machine learning classifier obtaining one or more recent results from at least one geomechanical simulation;
   the machine learning classifier comparing the recent results to stored historical data;
   based on the comparing, the machine learning classifier deciding at least one reservoir model for use by at least one reservoir simulation; and
   controlling the wellhead equipment using the results from the at least one geomechanical simulation and from the at least one reservoir simulation;
   wherein the at least one reservoir model is decided from a group comprising at least one of a single porosity model, a dual porosity model, and a dual permeability model.

2. A method for controlling wellhead equipment in a fluid reservoir, the method comprising:
   at least one machine learning classifier obtaining one or more recent results from at least one geomechanical simulation;
   the machine learning classifier comparing the recent results to stored historical data;
   based on the comparing, the machine learning classifier deciding at least one reservoir model for use by at least one reservoir simulation; and
   controlling the wellhead equipment using the results from the at least one geomechanical simulation and from the at least one reservoir simulation;
   the method further comprising:
   presenting the at least one decided reservoir model to a user; and
   the user selecting at least one reservoir model for use by at least one reservoir simulator based on at least one of:
       the at least one reservoir model decided by the at least one machine learning classifier; the recent results obtained from the geomechanical simulation; and expert domain knowledge of the user.

3. The method of claim 2, wherein:
   the stored historical data comprises at least one reservoir model previously selected by the user responsive to one or more prior results from the at least one geomechanical simulation,
   the comparing step comprises determining whether the one or more recent results are similar to the one or more prior results; and
   the deciding step comprises, if the one or more recent results are determined to be similar to the one or more prior results, deciding the at least one reservoir model based at least in part on the at least one reservoir model previously selected by the user responsive to the one or more prior results.

4. A method for controlling wellhead equipment in a fluid reservoir, the method comprising:
   at least one machine learning classifier obtaining one or more recent results from at least one geomechanical simulation;
   the machine learning classifier comparing the recent results to stored historical data;
   based on the comparing, the machine learning classifier deciding at least one reservoir model for use by at least one reservoir simulation; and controlling the wellhead equipment using the results from the at least one geomechanical simulation and from the at least one reservoir simulation, wherein:
the comparing step comprises determining at least one characteristic of at least one fracture in at least one geomaterial; and
the deciding step comprises the at least one machine learning classifier deciding the at least one reservoir model based at least in part on the determined characteristic of the fracture.

5. The method of claim 4, wherein the characteristic of the fracture comprises at least one of presence, movement, and connectedness.

6. The method of claim 5, wherein the deciding step comprises at least one of:
selecting at least one single porosity model if the fracture is not present or is not moving;
selecting at least one dual porosity model if the fracture is moving and connected; and
selecting at least one dual permeability model if the fracture is moving and not connected.

7. A method for controlling wellhead equipment in a fluid reservoir, the method comprising:
at least one machine learning classifier obtaining one or more recent results from at least one geomechanical simulation;
the machine learning classifier comparing the recent results to stored historical data;
based on the comparing, the machine learning classifier deciding at least one reservoir model for use by at least one reservoir simulation; and
controlling the wellhead equipment using the results from the at least one geomechanical simulation and from the at least one reservoir simulation, wherein:
the one or more recent results from the at least one geomechanical simulation comprises at least one point, each point comprising at least one strain value and at least one stress value for at least a given geomaterial; and
the stored historical data comprises at least one stress-strain curve for at least the given geomaterial.

8. The method of claim 7, wherein the stored historical data comprises a plurality of stress-strain curves for the given geomaterial.

9. The method of claim 8, wherein the stored historical data further comprises:
an average stress-strain curve for the given geomaterial;
at least one stress-strain curve based at least in part on:
the average stress-strain curve for the given geomaterial; and
a standard deviation of the plurality of stress-strain curves for the given geomaterial.

10. The method of claim 7, wherein:
the at least one point in the one or more recent results from the at least one geomechanical simulation comprises a current point for at least a given geomaterial;
the current point for the given geomaterial comprises a current stress value and a current strain value; and
the deciding step comprises at least one of:
selecting at least one single porosity model if the current point is within a pre-peak area of the at least one stress-strain curve for at least the given geomaterial;
selecting at least one dual porosity model if the current point is within a peak area of the at least one stress-strain curve for at least the given geomaterial; and selecting at least one dual permeability model if the current point is within a post-peak area of the at least one stress-strain curve for at least the given geomaterial.

11. The method of claim 7, wherein:
the at least one point in the one or more recent results from the at least one geomechanical simulation comprises a plurality of points for at least the given geomaterial from the at least one geomechanical simulation;
each of the plurality of points for the given geomaterial comprises a respective stress value and a respective strain value;
the comparing step comprises computing a proportion of the plurality of points which are within a pre-peak area of the at least one stress-strain curve for at least the given geomaterial.

12. The method of claim 11, wherein the plurality of points for at least the given geomaterial from the at least one geomechanical simulation a current point for at least a given geomaterial comprises a current point and at least one prior point.

13. The method of claim 11, wherein:
the comparing step further comprises determining at least one characteristic of at least one fracture in at least the given geomaterial based at least in part on the computed proportion; and the deciding step comprises the at least one machine learning classifier deciding the at least one reservoir model based at least in part on the determined characteristic of the fracture.

14. The method of claim 11, wherein the deciding step comprises at least one of:
selecting at least one single porosity model if the proportion is less than a first value;
selecting at least one dual porosity model if the proportion is between the first value and a second value, the second value being greater than the first value; and
selecting at least one dual permeability model if the proportion is greater than the second value.

15. The method of claim 14, wherein the first value is about forty per cent, and wherein the second value is about sixty percent.

16. The method of claim 7, wherein:
the stored historical data comprises a plurality of stress-strain curves comprising at least one stress-strain curve for each of a plurality of geomaterials comprising at least the given geomaterial.

17. A method for controlling wellhead equipment in a fluid reservoir, the method comprising:
at least one machine learning classifier obtaining one or more recent results from at least one geomechanical simulation;
the machine learning classifier comparing the recent results to stored historical data;
based on the comparing, the machine learning classifier deciding at least one reservoir model for use by at least one reservoir simulation; and
controlling the wellhead equipment using the results from the at least one geomechanical simulation and from the at least one reservoir simulation, wherein:
the comparing step comprises the machine classifier determining whether the stored historical data is sufficient for training the machine classifier; and
the deciding step comprises at least one of:
if the stored historical data is sufficient for training the machine learning classifier, automatically implementing the at least one reservoir model decided by the machine learning classifier; and if the stored historical data is not sufficient for training the machine learning classifier, obtaining confirmation from a user prior to implementing the at least one reservoir model decided by the machine learning classifier.

* * * * *